(12) United States Patent
Kim

(10) Patent No.: US 12,399,473 B2
(45) Date of Patent: Aug. 26, 2025

(54) COMPUTING SYSTEM FOR VIRTUAL SENSOR IMPLEMENTATION USING DIGITAL TWIN AND METHOD FOR REALTIME DATA COLLECTION THEREOF

(71) Applicant: KOREA DIGITAL TWIN LAB. INC., Daejeon (KR)

(72) Inventor: Tag Gon Kim, Daejeon (KR)

(73) Assignee: KOREA DIGITAL TWIN LAB. INC., Daejeon (KR)

( * ) Notice: Subject to any disclaimer, the term of this patent is extended or adjusted under 35 U.S.C. 154(b) by 919 days.

(21) Appl. No.: 17/555,938

(22) Filed: Dec. 20, 2021

(65) Prior Publication Data

US 2022/0197231 A1 Jun. 23, 2022

Related U.S. Application Data

(63) Continuation of application No. PCT/KR2020/007867, filed on Jun. 18, 2020.

(30) Foreign Application Priority Data

Jun. 20, 2019 (KR) .................. 10-2019-0073330

(51) Int. Cl.
   *G05B 17/02* (2006.01)
   *G05B 23/02* (2006.01)
   *G06F 30/20* (2020.01)

(52) U.S. Cl.
   CPC .......... *G05B 17/02* (2013.01); *G05B 23/024* (2013.01); *G05B 23/0254* (2013.01); *G06F 30/20* (2020.01)

(58) Field of Classification Search
   CPC .. G05B 17/02; G05B 23/024; G05B 23/0254; G05B 23/0297; G05B 23/0221;

(Continued)

(56) References Cited

U.S. PATENT DOCUMENTS

2010/0050025 A1* 2/2010 Grichnik ................ G05B 17/02
                                                              714/E11.2
2017/0286572 A1* 10/2017 Hershey .................... B64F 5/60
(Continued)

FOREIGN PATENT DOCUMENTS

KR       10-2019-0013610 A      2/2019

OTHER PUBLICATIONS

Yun et al., "Deep Learning Based Temperature Sensor Data and Wildfire Propagation Prediction in Duty Cycled Wireless Sensor Network," Proceedings of Symposium of the Korean Institute of communications and Information Sciences , 2019.1, 844-845.

(Continued)

*Primary Examiner* — Chuen-Meei Gan
(74) *Attorney, Agent, or Firm* — United One Law Group LLC; Kongsik Kim; Jhongwoo Peck

(57) ABSTRACT

Disclosed herein is a computing system for implementing a physics-based model, including a physics-based model configured to describe a physical complex system and perform deductive inference, and at least one processor. The at least one processor is configured to receive first data obtained such that the state information of first nodes is included therein in association with at least one of the passage of time and spatial distribution, to identify the state information for each of the first nodes in the physics-based model based on the first data in association with at least one of the passage of time and spatial distribution, and to determine parameters between variables in the physics-based model so that the state information can be reproduced for each of the first nodes in association with at least one of the passage of time and spatial distribution.

15 Claims, 14 Drawing Sheets

(58) Field of Classification Search
CPC ..... G05B 23/0283; G06F 30/20; G06F 30/27; G06N 20/00
See application file for complete search history.

(56) References Cited

U.S. PATENT DOCUMENTS

| | | |
|---|---|---|
| 2019/0033850 A1 | 1/2019 | B R et al. |
| 2019/0068618 A1 | 2/2019 | Mestha et al. |
| 2019/0230106 A1* | 7/2019 | Abbaszadeh ....... H04L 63/1441 |

OTHER PUBLICATIONS

Song et al., "A Simulation Model for the Study on the Forest Fire Pattern," The Korea Society For Simulation Prodeedings, Nov. 2012, 176-183.

Lee et al., "Development of integrated platform technology for fire disaster support capable of predicting and actively responding to digital twins," Preliminary planning report of research, Aug. 2018.

* cited by examiner

COMPUTING SYSTEM FOR VIRTUAL SENSOR IMPLEMENTATION USING DIGITAL TWIN AND METHOD FOR REALTIME DATA COLLECTION THEREOF

CROSS-REFERENCE TO RELATED APPLICATION

This application is a Continuation of PCT/KR2020/007867 filed on Jun. 18, 2020, which claims priority to Korean Application No. 10-2019-0073330 filed on Jun. 20, 2019. The aforementioned applications are incorporated herein by reference in their entireties.

TECHNICAL FIELD

The present invention relates to technology for modeling and simulating a physical complex system, and more particularly to technology for collecting sensor-based data by using a digital twin and enhancing a model by expanding data.

The present invention was derived from the research conducted as part of the Technology Transfer Commercialization Project of the Korean Ministry of Science and ICT and the Korea Innovation Foundation [task management number: 2019-DD-RD-0056-01-101; task name: Machine Learning-Embedded Digital Twin Modeling Simulation Platform Development].

RELATED ART

Demands for improvement in productivity, economic efficiency, and safety in the industrial field are spreading. Recently, technologies such as the Internet of Things (IoT), big data, artificial intelligence, and cyber physical systems (CPS) have been widely used. As a technology trend into which these technologies are integrated, digital twin technology is attracting attention.

A digital twin is a digital replica of a physical object (an asset, a process, a system, or the like), and is a virtual model that maintains the properties/states of target object elements throughout their lifecycle and describes dynamic nature regarding how they behave.

Digital twins implemented in computing systems are used in the industrial field for various purposes, such as predicting a situation that may occur in reality or informing a condition for optimizing operation while reflecting a real situation in conjunction with a target object (a physical asset), and are recognized as a means for enhancing competitiveness.

IoT technology and digital twin technology are closely related with each other. The advancement of IoT platform technology enables smart services such as machine learning/artificial intelligence (AI)-based prediction, failure diagnosis, optimization, and predictive diagnosis after the collection of the sensor data of an operating system in real time. Digital twin technology was started on the assumption that it was used in the industrial field, but recently, efforts are being made to expand its application areas to more diverse smart services, such as a cyber city. It is substantially impossible to mount all sensors for collecting all data required for various smart services in an operating system due to physical constraints (the locations and number of sensors) and/or economic constraints (the number of sensors).

As a means for partially solving this problem, U.S. Patent Application Publication No. 2017/0286572 entitled "Digital Twin of Twinned Physical System" discloses a technology that simulates the operation of a real sensor by using a digital twin of the real sensor, and, when the real sensor stops working, collects data from a virtual sensor corresponding to the real sensor in a digital twin model and replaces the operation of the real sensor.

Korean Patent Application Publication No. 10-2019-0013610 entitled "System, Method, and Control Unit for Controlling the Operation of a Technical System" discloses a technology that generates virtual sensor data using a digital twin of a real sensor and replaces the abnormal real sensor with the virtual sensor data when an abnormality of the real sensor is detected.

U.S. Patent Application Publication No. 2019/0068618 entitled "Using Virtual Sensors to Accommodate Industrial Asset Control Systems during Cyber Attacks" discloses a technology that simulates a digital twin model for a normal case and a cyberattack case and dynamically replaces an attacked one of real sensors with a virtual sensor when a system is actually attacked.

However, even according to these preceding documents, in order to obtain virtual sensor data, normal/abnormal data for a virtual sensor can be obtained only when a real sensor is present at a corresponding location. Only the data obtained during the normal operation of the real sensor can contribute to the implementation of virtual sensor data.

In other words, it is difficult to obtain virtual sensor data for a physical location where a real sensor cannot be actually arranged.

Meanwhile, digital twin technology is not only used in the industrial field, but is also used for attempts to expand its application fields into fields such as a cyber city. Since the virtual sensor technologies proposed in the preceding documents necessarily require data from a real sensor, this is an obstacle to the expansion of the digital twin technology.

SUMMARY

In the prior art and the above-described preceding art, a digital twin is simulated using all datasets including data obtained from a real physical sensor. In the prior art and the above-described preceding art, when a real physical sensor does not operate or is cyber attacked, the data of a virtual sensor replaces the real physical sensor and then operates. In order to obtain the data of a virtual sensor used in the above case, at least data of a real physical sensor operating normally is absolutely required.

The present invention has been contrived to overcome the problems of the prior art and the above-described preceding art, and an object of the present invention is to implement a desired number of virtual sensors having functions (accuracy) and performance (real-time) equivalent to those of real sensors at desired locations in a system and expand the range of data that a digital twin model can provide.

An object of the present invention is to provide a digital twin model that can implement a virtual sensor even for a location where a real sensor cannot be installed and/or arranged and can predict/infer the operation of an overall complex system based on the virtual sensor.

An object of the present invention is to provide a digital twin model and a virtual sensor model using original data that can describe a macroscopic or microscopic operation having actually occurred in a plurality of real sensors and an overall complex system.

An object of the present invention is to provide a digital twin and a virtual sensor model that can obtain a virtual sensor dataset for a node in which a real sensor is not installed and/or arranged based on original data that can describe a macroscopic or microscopic operation having actually occurred in a plurality of real sensors and an overall complex system.

An object of the present invention is to provide a digital twin model and a virtual sensor model that can implement a virtual sensor even for a quantity of different range, capacity, and/or dimension from the physical quantity measured by a real physical sensor. More specifically, there may be implemented a virtual sensor that can provide a virtually measured value even for a physical quantity in a range that exceeds a limited range that can be measured by a real physical sensor. There may be implemented a virtual sensor capable of providing a virtually measured value for a quantity of different range, capacity, and/or dimension from the physical quantity measured by a real physical sensor.

An object of the present invention is to provide a digital twin model including a virtual sensor and also propose a real-time data collection method using a digital twin model and a virtual sensor model.

The present invention has been conceived to accomplish the above objects. A computing system according to an embodiment of the present invention is a computing system for implementing a physics-based model, and includes a physics-based model configured to describe a physical complex system and perform deductive inference, and at least one processor. The at least one processor is configured to receive first data obtained such that the state information of first nodes, which are at least some of a plurality of nodes included in the physics-based model, is included therein in association with at least one of the passage of time and spatial distribution, to identify the state information for each of the first nodes in the physics-based model based on the first data in association with at least one of the passage of time and spatial distribution, and to determine parameters between variables in the physics-based model so that the state information can be reproduced (by modeling and/or simulation) for each of the first nodes in association with at least one of the passage of time and spatial distribution. In this case, the first data may be selected to include data related to the macroscopic operation of the complex system.

The at least one processor may be further configured to determine the parameters between the variables in the physics-based model by performing machine learning on the state information associated with at least one of the passage of time and the spatial distribution for each of the first nodes.

The at least one processor may be further configured to receive second data obtained such that the state information of second nodes, which are at least some of the plurality of nodes included in the physics-based model, is included therein, and to generate third data including state information for all of the plurality of nodes included in the physics-based model by inputting the second data to the physics-based model.

The at least one processor may be further configured to determine that the second nodes included in the third data have a value that is given by the second data, and to determine that the remaining nodes other than the second nodes included in the third data have a value that is inferred based on the second data by the physics-based model.

Assuming that the first nodes are distributed in space, changes in state information of the first nodes with the passage of time may be represented in the first data; the physics-based model may include, as the variables, at least the state information of the first nodes with the passage of time; and the physics-based model may include, as the parameters, at least the relevance between the state information of the first nodes with the passage of time and the state information of other nodes spatially adjacent to the first nodes.

The at least one processor may be further configured to identify changes in the state information of the first nodes with the passage of time based on the first data, and to determine the parameters representative of at least the relevance between the state information of the first nodes with the passage of time and the state information of the other nodes spatially adjacent to the first nodes in the physics-based model so that the changes in the state information of the first nodes with the passage of time can be reproduced by modeling and/or simulation.

At least some of the plurality of nodes may be set to have state information of a physical dimension different from that of the rest of the plurality of nodes.

A computing system according to an embodiment of the present invention is a computing system for implementing a digital twin model, and includes at least one processor, and a digital twin model configured to describe a physical complex system and including a plurality of second nodes corresponding to a plurality of physical sensors arranged in the complex system. The at least one processor is configured to obtain a reference dataset including the data of all nodes in the digital twin model, to assign at least one virtual sensor to each of a plurality of third nodes, which are the rest excluding the plurality of second nodes among all the nodes in the digital twin model, and to learn the correlation between data provided by the plurality of physical sensors and data that the at least one virtual sensor has based on the reference data set, and generate a virtual sensor model that describes the at least one virtual sensor.

The at least one processor may be further configured to simulate the digital twin model by applying a plurality of scenarios to the digital twin model, and to obtain a simulation result dataset, including the data of all the nodes in the digital twin model, as the reference dataset.

The at least one processor may be further configured to allocate data, provided by the plurality of physical sensors, to the plurality of second nodes, to input the data of the plurality of second nodes to the virtual sensor model, and to control the virtual sensor model so that the virtual sensor model learns the relevance between the data of the plurality of second nodes and the data of the plurality of third nodes.

The at least one processor may be further configured to newly allocate new data, provided by the plurality of physical sensors, to the plurality of second nodes, to input data, newly allocated to the plurality of second nodes, to the virtual sensor model, and to control the virtual sensor model so that the virtual sensor model updates a learning result for the relevance between the data of the plurality of second nodes and the data of the plurality of third nodes.

The at least one processor may be further configured to newly allocate new data, provided by the plurality of physical sensors, to the plurality of second nodes, to input data, newly allocated to the plurality of second nodes, to the virtual sensor model, and to control the virtual sensor model so that the virtual sensor model updates a learning result for the relevance between the data of the plurality of second nodes and the data of the plurality of third nodes.

The at least one processor may be further configured to designate data, having a physical dimension different from that of the physical quantity of data detected by the plurality of physical sensors, as the physical quantity of the data of the at least one virtual sensor.

The at least one processor may be further configured to control the virtual sensor model so that the virtual sensor model predicts the value of any one fourth node of the plurality of third nodes in the digital twin model and the value of a first virtual sensor corresponding to the fourth node under the condition that the plurality of second nodes and the plurality of physical sensors match each other so that the plurality of second nodes in the digital twin model has the value of data provided by the plurality of physical sensors based on the reference data set.

The at least one processor may be further configured to control the virtual sensor model so that the virtual sensor model predicts the value of each of a plurality of second virtual sensors corresponding to each of the plurality of third nodes in the digital twin model under the condition that the plurality of second nodes and the plurality of physical sensors match each other so that the plurality of second nodes in the digital twin model has the value of data provided by the plurality of physical sensors based on the reference data set.

The virtual sensor model may be a model using an artificial neural network.

A method of providing a physics-based model that is performed in a computing system according to an embodiment of the present invention is performed in a computing system including a physics-based model configured to describe a physical complex system and perform deductive inference and at least one processor. The method of providing a physics-based model includes: receiving, by the at least one processor, first data obtained such that the state information of first nodes, which are at least some of a plurality of nodes included in the physics-based model, is included therein in association with at least one of the passage of time and spatial distribution; identifying, by the at least one processor, the state information for each of the first nodes in the physics-based model based on the first data in association with at least one of the passage of time and spatial distribution; and determining, by the at least one processor, parameters between variables in the physics-based model so that the state information can be reproduced (by modeling and/or simulation) for each of the first nodes in association with at least one of the passage of time and spatial distribution.

The method may further include: receiving, by the at least one processor, second data obtained such that the state information of second nodes, which are at least some of the plurality of nodes included in the physics-based model, is included therein; and generating, by the at least one processor, third data including state information for all of the plurality of nodes included in the physics-based model by inputting the second data to the physics-based model.

A method of providing a digital twin model that is performed in a computing system according to an embodiment of the present invention is performed in a computing system including a digital twin model configured to describe a physical complex system and including a plurality of second nodes corresponding to a plurality of physical sensors installed and/or arranged in the complex system, and at least one processor. The method of providing a digital twin model includes: obtaining, by the at least one processor, a reference dataset including the data of all nodes in the digital twin model; assigning, by the at least one processor, at least one virtual sensor to each of a plurality of third nodes, which are the rest excluding the plurality of second nodes among all the nodes in the digital twin model; and learning, by the at least one processor, the correlation between data provided by the plurality of physical sensors and data that the at least one virtual sensor has based on the reference data set, and generating, by the at least one processor, a virtual sensor model that describes the at least one virtual sensor.

The obtaining may include: simulating, by the at least one processor, the digital twin model by applying a plurality of scenarios to the digital twin model; and obtaining, by the at least one processor, a simulation result dataset, including the data of all the nodes in the digital twin model, as the reference dataset.

According to the present invention, a desired number of virtual sensors having functions (accuracy) and performance (real-time) equivalent to those of real sensors may be implemented at desired locations in a system, and the range of data that a digital twin model can provide may be expanded.

According to the present invention, a virtual sensor may be implemented even at a location where an actual sensor cannot be installed and/or arranged. Furthermore, a virtual sensor may be implemented for a physical quantity measured by a real sensor and a physical quantity of another type (or dimension) related thereto. According to the present invention, a virtual sensor may be implemented at a corresponding location for a physical quantity measured by a real physical sensor at the corresponding location and another type of physical quantity related thereto. The expansion of data by the virtual sensor may allow a virtual sensor to be implemented at a corresponding location even for a physical quantity measured by the physical sensor and a physical quantity outside the range of the measured physical quantity. For example, the maximum and minimum values of the measurement range of the physical sensor are limited due to the physical characteristics of the sensor, so that the sizes thereof may be limitative. In contrast, the physical quantity of the virtual sensor is the variable value of a system model, so that the virtual sensor may operate within a theoretically determined range that can appear in the operating range of the system. Since the maximum and minimum values of the physical sensor will be more restrictive than the maximum and minimum values of the model variable values, the virtual sensor may provide a virtually measured value that is outside the measurement range that the physical sensor can measure. For example, there may be a case where the operating range of the model variable value is −10 to +10, whereas the measurement range of the physical sensor is −5 to +5.

In addition, a virtual sensor may be implemented for a quantity of different range, capacity, and/or dimension from the physical quantity measured by a physical sensor. A physical quantity to be measured by a virtual sensor may be the same as the physical quantity (e.g., acceleration) of another physical sensor device, and a physical quantity (e.g., velocity—the value obtained by integrating acceleration) different from the value measured by the physical sensor may also be utilized as the measurement value of the virtual sensor by using the operation law (model) of the system.

According to the present invention, a digital twin model including a virtual sensor may be provided. Furthermore, a virtual sensor model using a digital twin model may be provided, and a virtual sensor may be implemented.

According to the present invention, real-time data may be collected using a digital twin model and a virtual sensor model.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Objects of the present invention other than the above-described objects and the features of the present invention will be apparent from the following description of embodiments to be given with reference to the accompanying drawings.

Embodiments of the present invention will be described in detail below with reference to the accompanying drawings. In the following description of the present invention, when it is determined that a detailed description of a related known component or function may unnecessarily make the gist of the present invention obscure, it will be omitted.

Figure 1:
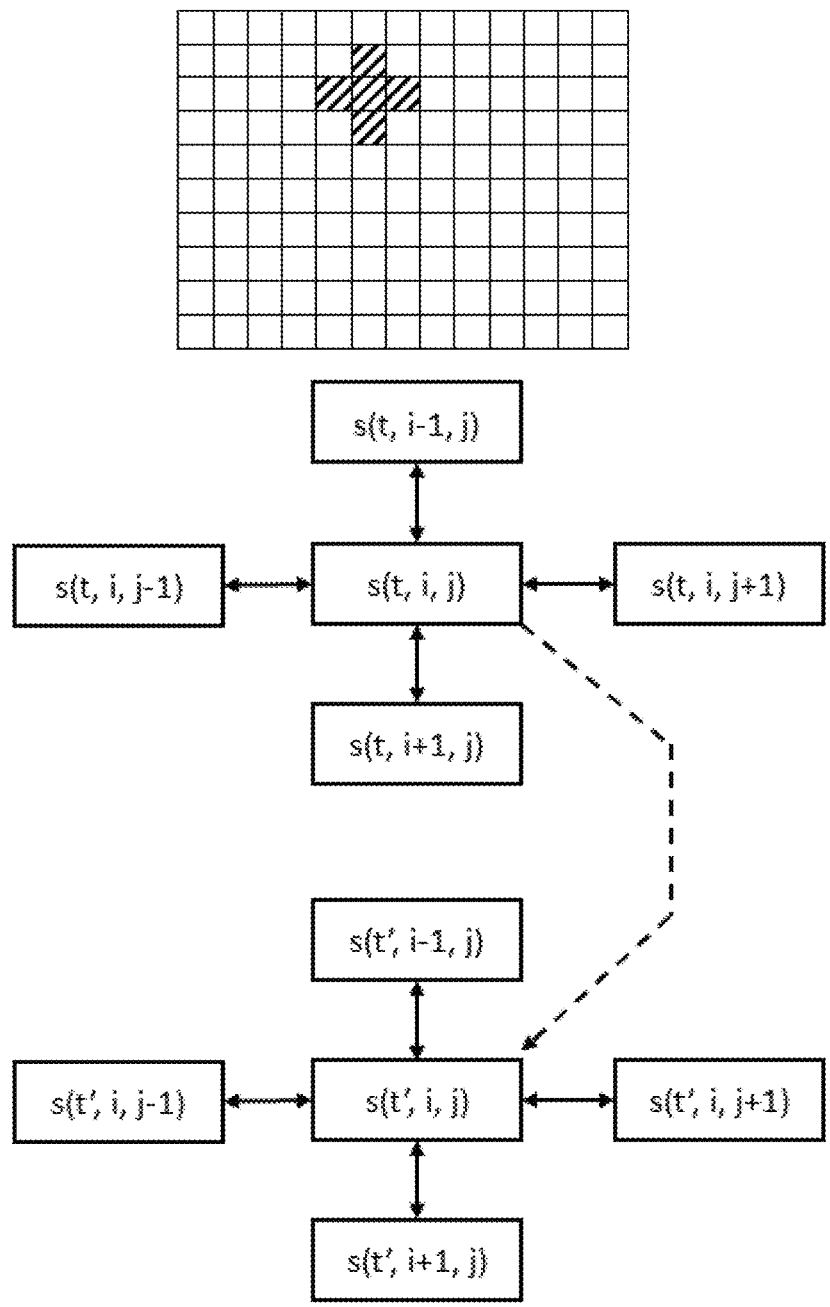
FIG. 1 is a diagram showing an example of a method by which a computing system according to an embodiment of the present invention describes a change in the state of a node in a physics-based model.

FIG. 1 is a diagram showing an example of a method by which a computing system according to an embodiment of the present invention describes a change in the state of a node in a physics-based model.

A physics-based model is a model that describes a physical phenomenon through deductive inference based at least in part on a physical law. The part that can be described using a physical law is performed by deductive inference, and the state of a specific node may be updated by partially applying machine learning when necessary.

FIG. 1 shows by way of example a model in which a physical complex system is divided into cells according to spatial distribution and the state information of each of the cells is updated with the passage of time. State variable $s(i, j)$ of cell $(i, j)$ may be updated with the passage of time. In this case, when time t is included, the state variable may be expressed as $s(t, i, j)$. Each of the cells may be set to correspond to one node.

For example, state variable $s(t', i, j)$, to which state variable $s(t, i, j)$ is updated after a predetermined period of time, may be affected by state variable $s(t, i, j)$ of cell/node $(i, j)$ and state variables $s(t, i, j-1)$, $s(t, i-1, j)$, $s(t, i+1, j)$, and $s(t, i, j+1)$ of adjacent cells/nodes $(i, j-1)$, $(i-1, j)$, $(i+1, j)$, and $(i, j+1)$.

In this case, the relevance parameters between state variables $s(t', i, j)$ obtained through updating after a predetermined period of time, and state variable $s(t, i, j)$ and state variables $s(t, i, j-1)$, $(t, i-1, j)$, $s(t, i+1, j)$ and $s(t, i, j+1)$ of the adjacent cells/nodes may be set as the parameters of the physics-based model that describes the complex system of FIG. 1. Meanwhile, $s(t'', i, j)$, which is the next state of the state variable $s(t', i, j)$, may be obtained through state variable $s(t', i, j)$, state variables $s(t', i, j-1)$, $s(t', i-1, j)$, $s(t', i+1, j)$ and $s(t', i, j+1)$ of the adjacent cells/nodes, and the parameters of the physics-based model.

Although only the cells/nodes that are directly adjacent in space are illustrated as affecting the next state in FIG. 1, this is only one embodiment. Depending on physical laws, there may be present various patterns that affect changes in the state of each node according to spatial distribution and the passage of time. Such a pattern may be defined by a physical law, or may be searched for by a process such as machine learning.

Furthermore, although an embodiment in which each node is defined according to spatial distribution and the state information of the node is updated with the passage of time is illustrated in FIG. 1, the spirit of the present invention is not limited thereto. In a physics-based model, each node may be divided and defined by at least one of spatial distribution and/or the passage of time, and a change in the state of the node may be updated and tracked according to at least one of spatial distribution and the passage of time.

As examples of the state information represented by each node according to the spatial distribution in FIG. 1, there are the spread of a forest fire, the spread of a fire in a building, the current state of flooding in a specific area, and the current state of flooding in each region of a ground/underground facility (e.g., a subway station, a tunnel, or the like). Furthermore, in an application such as a cyber city, the state information may be representative of information about the current state of a traffic flow or whether traffic congestion has occurred in the overall area or a partial area of the city. Based on such state information, various service models such as intelligent evacuation route guidance, movement route guidance optimized in a current situation, etc. may be obtained by applying the physics-based model, digital twin model, and virtual sensor model of the present invention.

In addition, when the present invention is used in an industrial field, a node may be each production facility in a production line or each part in a production facility, and state information may be data on vibration, heat generation, noise, etc. The information that can be determined through these settings may include information such as whether an abnormality has occurred in a production facility, the location of an abnormal production facility or an abnormal part, and the degree of abnormality.

Figure 2:
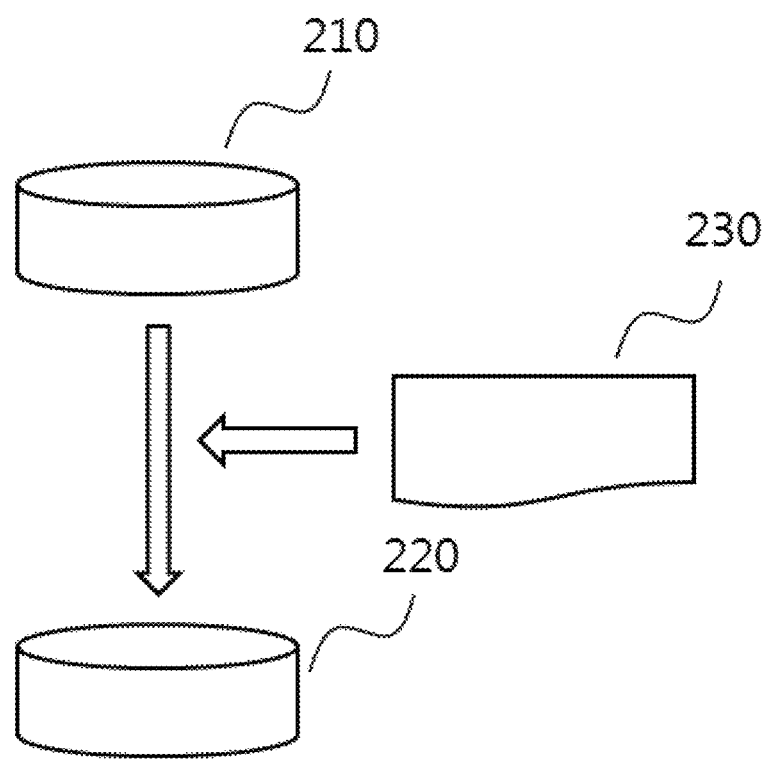
FIG. 2 is a diagram showing an example of a process in which a computing system learns a physics-based model by using first data according to an embodiment of the present invention.

FIG. 2 is a diagram showing an example of a process in which a computing system learns a physics-based model 210 by using first data 230 according to an embodiment of the present invention.

A computing system according to an embodiment of the present invention is a computing system that implements physics-based models 210 and 220, and includes the physics-based model (before learning) 210 is implemented to describe a physical complex system and be capable of performing deductive inference, and at least one processor (not shown). The at least one processor receives the first data 230 obtained such that the state information of first nodes, which are at least some of a plurality of nodes included in the physics-based model 210, is included therein in association with at least one of the passage of time and spatial distribution.

The at least one processor identifies the state information for each of the first nodes in the physics-based model 210 based on the first data 230 in association with at least one of the passage of time and spatial distribution in that the first data 230 has been obtained by real/actual observation and/or sensing. The at least one processor determines parameters between variables in the physics-based model 210 so that the state information can be reproduced (by modeling and/or simulation) for each of the first nodes in association with at least one of the passage of time and spatial distribution. In this case, the first data 230 may be selected to include data representative of the macroscopic operation and/or microscopic operation of the complex system. As an example of the macroscopic operation, there may be assumed a case in which the physics-based model 210 is intended to describe a physical complex system including a mountain or a forest, nodes are set according to spatial distribution, and the first data 230 is the video data of a scene where a forest fire is spreading captured by a drone. In addition, the physics-based model 210 may infer the spread of a forest fire according to a physical law, and may set points in a forest or entities on respective points as nodes.

A moving picture dataset acquired by capturing a scene where a forest fire is spreading is an exemplary representative of state information based on the passage of time, and a change in the state information of each point in the moving picture corresponds to a change in state information based on spatial distribution. According to an embodiment, a set of data capable of representing a change in state based on another type of physical quantity other than changes in state based on the passage of time and spatial distribution may be selected as the first data 230.

The physics-based model 210 includes a plurality of nodes distinctive according to spatial distribution or the passage of time, and includes relevance parameters between variables representative of the state information of the individual nodes. A version in which relevance parameters between variables are determined by applying the first data 230 to the physics-based model 210 is shown as the physics-based model 220 after learning. The relevance parameters may be degrees of relevance between the state information of the nodes included in the physics-based model 210 and/or 220, degrees of relevance between the first data 230 and the state information of the nodes included in the physics-based model 210 and/or 220, degrees of relevance between the individual variables, or may be coefficients of the individual variables when the physics-based models 210 and/or 220 are represented by equations. Meanwhile, the relevance parameters may be determined to include constraints defined by the physical laws that changes in the states of the individual nodes need to follow.

The constraints may include basic physical principles such as the first law of thermodynamics, the second law of thermodynamics, and the law of conservation of energy, and may further include optimization conditions required for a specific application.

Another example of the first data 230 may include data that can list changes in traffic flow in a cyber city. In this case, the first data 230 may be video data that can list the traffic flow for an overall city or a specific area, or may be a set of data of the average speeds of vehicles measured at a specific point in a city. In other words, the first data 230 may be a set of visual information capable of providing macroscopic or microscopic information, or a set of quantity information.

Another example of the first data 230 may be data macroscopically representative of the spread of a forest fire, the spread of a fire in a building, the current state of flooding in a specific area, or the current state of flooding in each region of a ground/underground facility (e.g., a subway station, a tunnel, or the like). For example, it may be video data, or may include a set of data on a fire or a flooding state recognized by individual sensors and the statistical analysis thereof.

Another example of the first data 230 may include video data, including data on each production facility in a production line, whether an abnormality has occurred in each part in a production facility, vibration, heat generation, noise, and/or the like, or a set of data measured by a sensor, and the statistical analysis thereof.

In order to identify state information about first nodes, which are at least some of the physics-based model 210, based on the first data 230 in association with at least one of the passage of time and spatial distribution, and to determine internal parameters (constraints, the degrees of relevance, or coefficients) between variables in the physics-based model 210, there may be required a preprocessing process for identifying and matching each node (an object, an entity, a point, or the like) defined in the physics-based model 210 from the first data 230, which is original data.

A process in which the computing system learns the physics-based model 210 and generates the physics-based model 220 after learning, including the above preprocessing process, is shown in more detail in FIG. 3 below.

Figure 3:
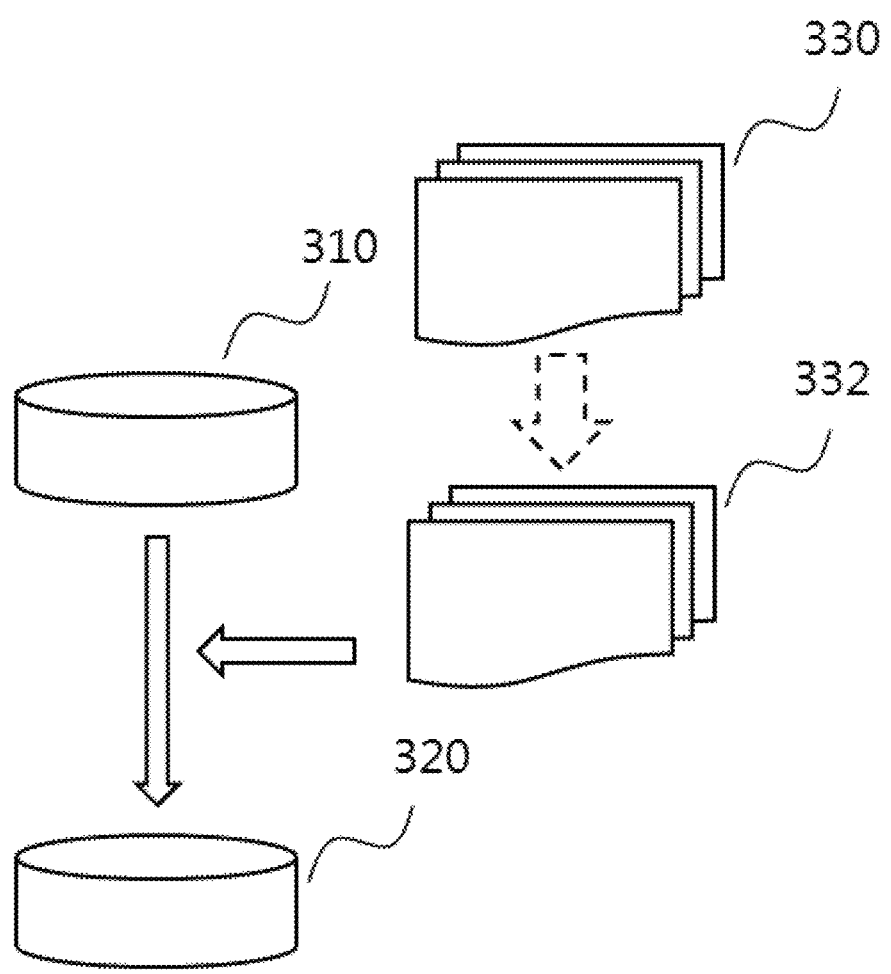
FIG. 3 is a diagram illustrating another example of a process in which a computing system learns a physics-based model by using first data according to an embodiment of the present invention.

FIG. 3 is a diagram illustrating another example of a process in which a computing system learns a physics-based model 310 by using first data 330 according to an embodiment of the present invention.

Since the physics-based model 310 before learning and the physics-based model 320 after learning are similar to those shown in FIG. 2, redundant descriptions thereof will be omitted.

The first data 330 is received as original data representative of the macroscopic or microscopic operation of a complex system described by the physics-based model 310.

The computing system identifies each node of the complex system in the first data 330 by analyzing the first data 330, and also identifies the state information of the node included in the first data 330 in association with at least one of the passage of time and spatial distribution. In this case, for example, when the first data 330 is a video, the computing system may analyze the first data 330 through a preprocessing process, and may identify each node based on the spatial distribution defined by the physics-based model 310 by searching for the node in the first data 330. The state information of each node based on the spatial distribution defined by the physics-based model 310 is tracked and identified with the passage of time in the first data 330. In other words, each node may be identified in association with spatial distribution, and the state information of each node may be identified and tracked in association with the passage of time.

The at least one processor in the computing system may determine the parameters between the variables in the physics-based model 310 by performing machine learning on the state information associated with at least one of the passage of time and the spatial distribution for each of the first nodes defined in the physics-based model 310. In other words, machine learning may be performed as a process in which the computing system determines parameters inside the physics-based model 310. In this case, since a plurality of pieces of first data 330 may be required to perform machine learning, the computing system may receive the first data 330, which is a plurality of pieces of original data, and may generate a plurality of input data sets 332 for machine learning by performing a preprocessing process on the first data 330.

The physics-based model 320 after learning, whose internal parameters are determined by machine learning, may update the internal parameters by periodically re-performing machine learning when necessary.

When second data based on a different modality (a physical sensor) is input to the physics-based model 320 after learning whose internal parameters are determined based on the first data 330 and input training data 332, the computing system may generate a mixed dataset, including a real sensor and a virtual sensor, as the third data based on the second data. The at least one processor in the computing system may receive the second data obtained such that the state information of second nodes, which are at least some of the plurality of nodes included in the physics-based model 320 after learning, is included therein, and may generate third data including state information for all of the plurality of nodes included in the physics-based model 320 after learning by inputting the second data to the physics-based model 320 after learning. Although it is desirable to identify all the nodes defined in the physics-based models 310 and 320 before or after learning based on the first data 330 and the input training data 332 and to determine the state variables thereof, only the first nodes, which are some of all nodes, may be identified from the first data 330 and the input training data 332, the state variables thereof may be identified and applied to the physics-based model 310, and parameters may be determined.

In this case, the parameters inside the physics-based model 320 determined by machine learning may include the state variables of nodes other than the first nodes. After the physics-based model 320 has been generated by learning, second data, which is sensing data for second nodes, which are some of the plurality of nodes, may be received based on a different modality. The second nodes may or may not overlap the first nodes. When the second data is input to the physics-based model 320, the nodes identified as second nodes in the physics-based model 320 are applied/adjusted/assigned to have the values provided by the second data, and the values of the remaining nodes other than the second nodes may be determined/inferred/predicted by a parameter set inside the physics-based model 320 determined by learning. In this case, the remaining nodes other than the second nodes are not really measured, but are indirectly determined based on the second nodes and the physics-based model 320. The remaining nodes may be treated like virtual sensors. The state variables of the respective nodes in the physics-based model 320 are learned to have relevance to the macro- or micro-states represented by the first data 330 and the input training data 332, and the distribution or relevance of the state variables of the respective nodes is also learned in the machine learning process according to the passage of time or spatial distribution and included in the parameter set inside the physics-based model 320. Given the state variables of at least some nodes (for example, second nodes) according to one temporal or spatial distribution based on real sensors, the data of the remaining nodes corresponding to the temporal or spatial distribution may be determined/inferred/predicted by the physics-based model 320.

Assuming that the first nodes of the physics-based model 320 are distributed in space, changes in the state information of the first nodes with the passage of time are represented in the first data 330, and the physics-based model 320 may include, as the variables, at least the state information of the first nodes with the passage of time. The physics-based model 320 may include, as the parameters, at least the relevance between the state information of the first nodes with the passage of time and the state information of other nodes spatially adjacent to the first nodes.

The at least one processor may identify changes in the state information of the first nodes with the passage of time based on the first data 330, and may determine parameters representative of the relevance between the state information of at least the first node with the passage of time and the state information of other nodes spatially adjacent to the first nodes in the physics-based model 320 in order to reproduce the changes in the state information of the first nodes with the passage of time by modeling and/or simulation.

At least some of the plurality of nodes in the physics-based models 310 and 320 before or after learning may be set to have state information of a physical dimension different from that of the rest of the plurality of nodes. Since nodes are set as simulation targets based on a physical law, it is not necessary to deal with one type of physical quantity, and nodes dealing with different type, range, modality, capacity, and/or dimension of physical quantities may be mixed together.

The computing system according to an embodiment of the present invention may implement a virtual sensor even at a location where a real sensor cannot be arranged. Furthermore, the computing system may implement a virtual sensor for a physical quantity measured by a real sensor and a physical quantity of another type (or another dimension) related to the former physical quantity. According to the present invention, a virtual sensor may be implemented for a corresponding location for a physical quantity measured by a real physical sensor at the corresponding location and other types of physical quantity related to the former physical quantity. In connection with the expansion of data by a virtual sensor, a virtual sensor may be implemented for a corresponding location even for a physical quantity measured by a physical sensor and a physical quantity outside the range of the measured physical quantity. For example, since the maximum and minimum values of the measurement range of the physical sensor are limit values attributable to the physical characteristics of the sensor, the sizes thereof may be limited. In contrast, the physical quantity of the virtual sensor is the variable value of the physics-based model 320, and may operate within a theoretically determined range that may appear in the operating range of the system. Since the maximum and minimum values of the physical sensor will be more limitative than the maximum and minimum values of the model variable values, the virtual sensor may provide a virtual measured value that is outside a measurable range that the physical sensor can measure. For example, there may be a case where the operating range of the model variable values is −10 to +10, but the measurable range of the physical sensor is −5 to +5.

In addition, a virtual sensor may be implemented for a quantity of different type, modality, capacity, range, and/or dimension from the physical quantity measured by the physical sensor. The physical quantity to be measured by the virtual sensor may be the same as that of a physical sensor device (e.g., acceleration), and a quantity different from the value measured by the physical sensor (e.g., velocity—a value obtained by integrating acceleration) may also be used as a measured value of the virtual sensor by using the operation law (model) of the complex system/system FIG. 4 is a diagram showing an example of a physics-based model, including sensors as nodes, as a physics-based model that is provided by a computing system according to an embodiment of the present invention.

Figure 4:
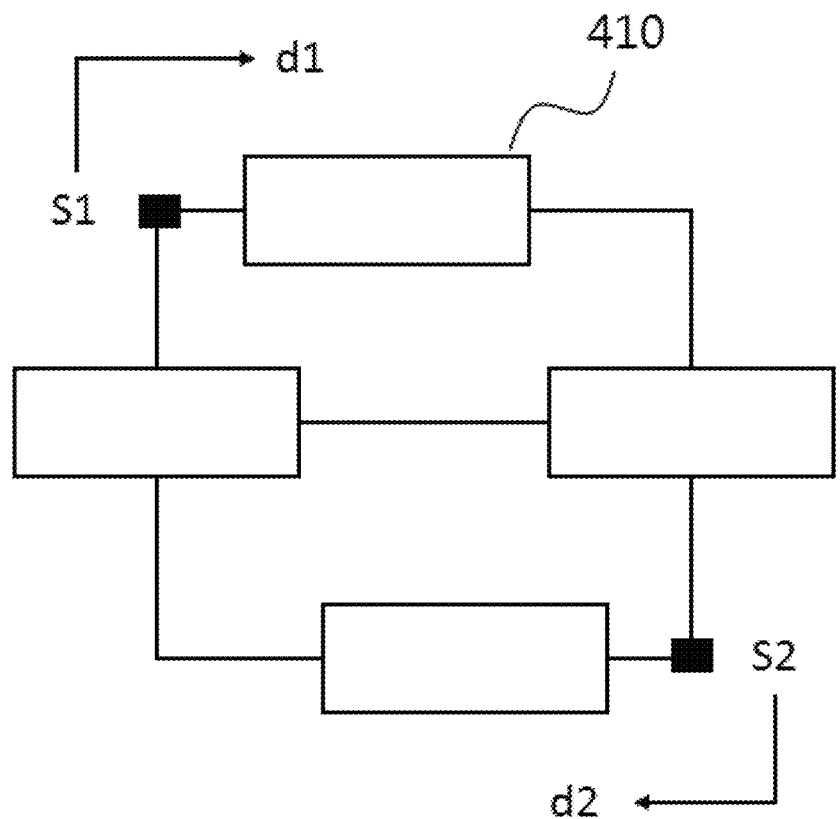
FIG. 4 is a diagram showing an example of a physics-based model, including sensors as nodes, as a physics-based model that is provided by a computing system according to an embodiment of the present invention.

Referring to FIG. 4, sensor nodes S1 and S2 are shown, and a relevance parameter 410 is shown between the sensor nodes S1 and S2. The first sensor data d1 obtained by the first sensor node S1 and the second sensor data d2 obtained by the second sensor node S2 will be obtained in order not to violate the constraints defined by the network of the relevance parameter 410. Meanwhile, when the first sensor data d1 and the second sensor data d2 violate the constraints, the computing system may request re-verification regarding whether the measured sensor data is appropriate.

The sensor nodes S1 and S2 may be real physical sensors or virtual sensors.

Figure 5:
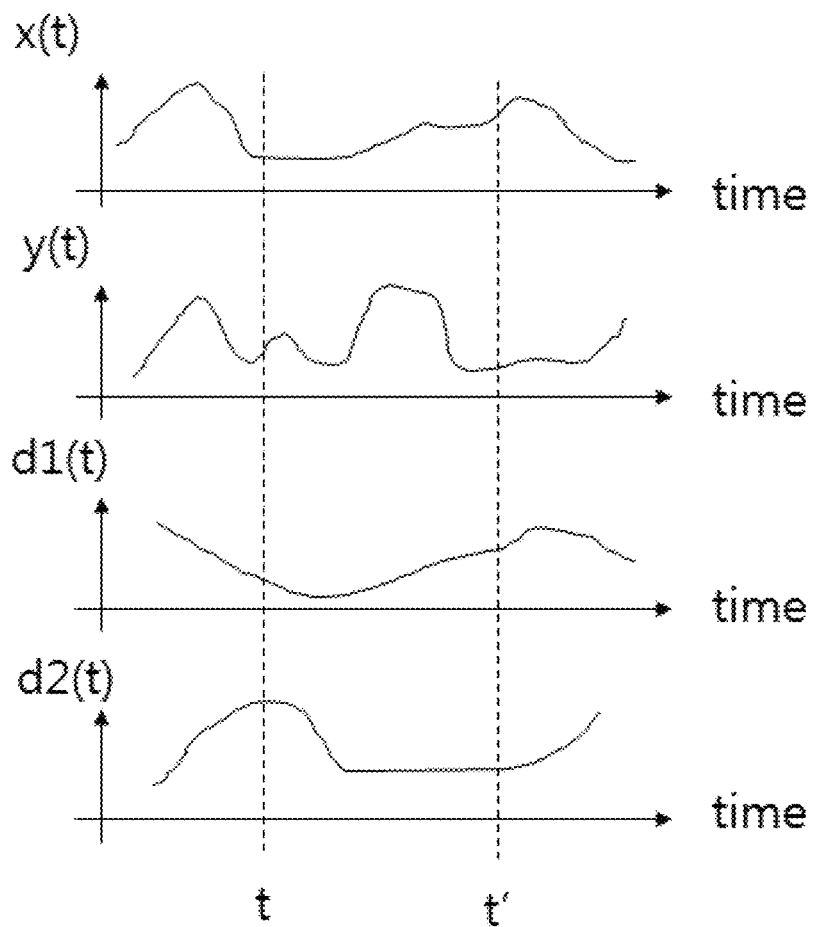
FIG. 5 is a diagram showing an example of a simulation, including a plurality of scenarios and control variables, as a simulation that is performed by a computing system according to an embodiment of the present invention.

FIG. 5 is a diagram showing an example of a simulation, including a plurality of scenarios and control variables, as a simulation that is performed by a computing system according to an embodiment of the present invention.

The values that the first sensor data d1 and the second sensor data d2 have with the passage of time are shown in FIG. 5. The first sensor data d1 and the second sensor data d2 expressed as a function of time may be represented by $d1(t)$ and $d2(t)$, respectively.

The physics-based model describing the complex system of the present invention includes relevance between a plurality of control variables x(t) and y(t) and sensor data $d1(t)$ and $d2(t)$. As a result of the simulation using the physics-based model, a graph may be obtained as shown in FIG. 5. The parameters in the physics-based model may be determined by the learning processes shown in FIGS. 1 to 3.

According to one scenario, the initial values of the control variables x(t) and y(t) and the sensor data $d1(t)$ and $d2(t)$ are determined, and changes in the control variables x(t) and y(t) and the sensor data $d1(t)$ and $d2(t)$ with the passage of time according to internal parameters may be tracked through simulation.

Based on the simulation of FIG. 5, control variables x(t) and y(t) and sensor data $d1(t)$ and $d2(t)$ at time t may be determined, and control variables x(t') and y(t') and sensor data $d1(t')$ and $d2(t')$ at another time t' may be obtained.

Each simulation scenario may define the initial values of the control variables x(t) and y(t) and the sensor data $d1(t)$ and $d2(t)$ or values at a specific time t or t', and may be applied as a reference condition.

The parameters in the physics-based model may define not only the relevance between the sensor data $d1(t)$ and $d2(t)$, but also the relevance between the control variables x(t) and y(t) and the sensor data d1 $(t)$ and $d2(t)$. The relevance between the information or control variables x(t) and y(t) of nodes, not obtained through physical sensors, and measured sensor nodes may be partially defined by the physical law on which a physics-based model depends, or may be searched for and determined through iterative machine learning using the plurality of pieces of input training data 332, as shown in FIG. 3.

The process of determining internal parameters by means of machine learning based on data science or big data and the process of determining internal parameters by means of a hypothetical model depending on a physical law may be used to complement each other. Some of these complementary applications are disclosed in preceding Korean Patent Application No. 10-2018-0043827 entitled "System Modeling Method Built-in Machine Learning using Big Data," and may be included as at least part of the present invention.

Figure 6:
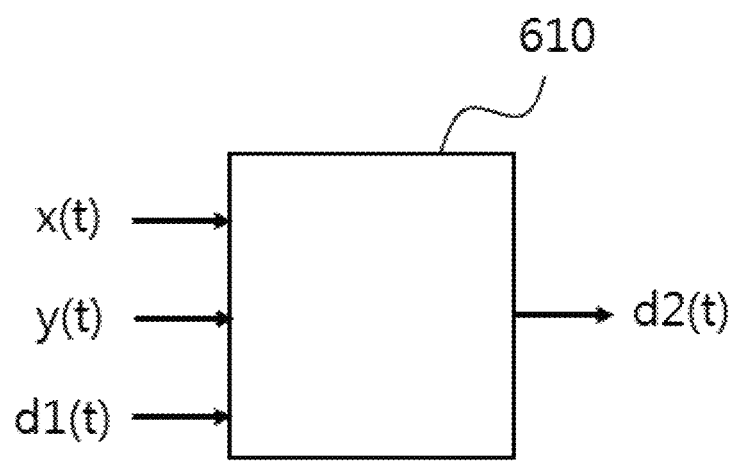
FIG. 6 is a diagram illustrating an example of a sensor model, obtained through conversion based on a physics-based model, as a sensor model that is provided by a computing system according to an embodiment of the present invention.

FIG. 6 is a diagram illustrating an example of a sensor model, obtained through conversion based on a physics-based model, as a sensor model that is provided by a computing system according to an embodiment of the present invention.

Referring to FIG. 6, a physics-based model may be converted into and shown as a sensor model 610 for $d2(t)$, which is one piece of sensor data. The first sensor data $d1(t)$ and the second sensor data $d2(t)$ may be obtained from the sensors S1 and S2 shown in FIG. 4. In this case, after the parameters inside the physics-based model have been determined through the learning processes of FIGS. 1 to 3, the computing system may convert the physics-based model into a sensor model 610 based on the relevance between the control variables x(t) and y(t) and the sensor data $d1(t)$ and $d2(t)$ according to a predetermined scenario, as shown in FIG. 5. The sensor model 610 has control variables x(t) and y(t) and first sensor data $d1(t)$ as inputs, and has second sensor data $d2(t)$ as an output. The degree of relevance between the inputs and output of the sensor model 610 may be defined by a hypothetical model in a deductive manner, or may be inferred based on machine learning using big data and simulation using a physics-based model, as shown in FIG. 5.

Figure 7:
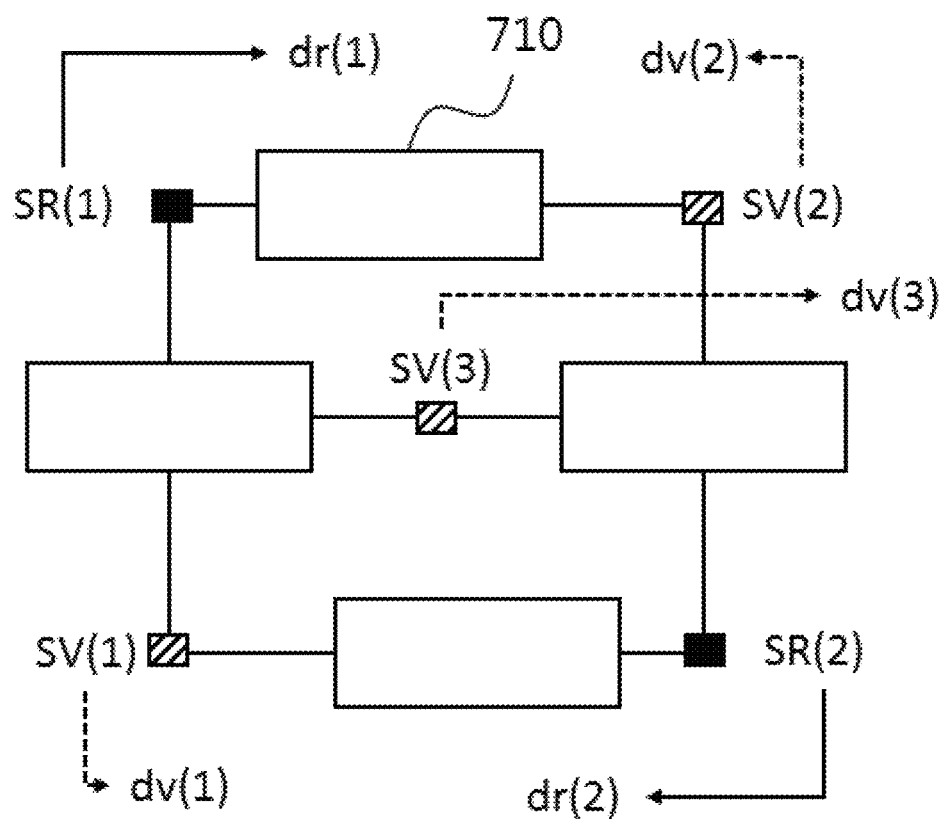
FIG. 7 is a diagram showing an example of a physics-based model, including virtual sensors and real physical sensors as nodes, as a physics-based model that is provided by a computing system according to an embodiment of the present invention.

FIG. 7 is a diagram showing an example of a physics-based model, including virtual sensors and real physical sensors as nodes, as a physics-based model that is provided by a computing system according to an embodiment of the present invention.

Figure 8:
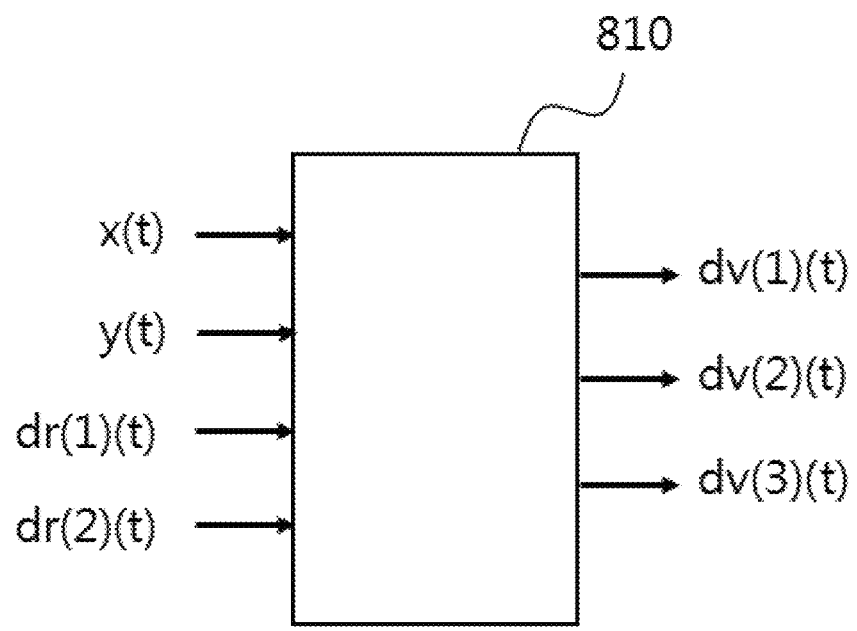
FIG. 8 is a diagram showing an example of a virtual sensor model for describing virtual sensors, obtained through conversion based on a physics-based model, as a sensor model that is provided by a computing system according to an embodiment of the present invention.

FIG. 8 is a diagram showing an example of a virtual sensor model for describing virtual sensors, obtained through conversion based on a physics-based model, as a sensor model that is provided by a computing system according to an embodiment of the present invention.

In an embodiment of the present invention, after all sensors required for a smart service have been identified, the sensors are divided into one or more real sensors that can be physically mounted in a complex system/system and one or more virtual sensors that are the remaining sensors. The data values collected from the real and virtual sensors are variable values that reflect a current system state when a target complex system/system operates. Accordingly, when a digital twin (a simulation model) in which these pieces of sensor data are reflected in a parameter 710 between model variables is constructed and then various complex system/system operation scenarios are simulated, big data in which both real sensor data values and virtual sensor data values are included may be secured. A data model (e.g., an artificial neural network) that has trained on the correlations between the real sensor data values and the virtual sensor data values by using the obtained big data through machine learning is obtained and then used as a virtual sensor. Accordingly, when the data values of a real sensor reflecting a current state are collected in real time during a complex system/system operation, the virtual sensor may obtain the data values of the virtual sensor in real time in the same state.

The complex system/system may be designed or implemented to collect data using a plurality of sensors and provide services such as system analysis and prediction. In this case, it is assumed that for some reason, the real sensors SR(1) and SR(2) can be installed and/or arranged, but SV(1) to SV(3) cannot be installed and/or arranged. In this case, pieces of real sensor data dr(1) and dr(2) may be collected by the real sensors SR(1) and SR(2), and pieces of virtual sensor data dv(1) to dv(3) may be obtained suing the virtual sensor SV(1) to SV(3). In order to obtain the state variables of the virtual sensors SV(1) to SV(3), first, the real sensors SR(1) and SR(2) and the virtual sensors SV(1) to SV(3) are included in the variables of the complex system/system, and then a system model M capable of obtaining these variable values dr(1) and dr(2) and dv(1) to dv(3) is obtained. The system model M is a set formed by the parameters 710 between model variables, and includes the relevance between the individual variables. Thereafter, the training data TD={(dr(1), dr(2), dv(1), dv (2), dv(3))_i|i: number of simulations)} required for the virtual sensors SV(1) to SV(3) may be obtained by performing simulations, to which various operating scenarios are applied, on the model M.

A machine learning data model (e.g., an artificial neural network) (dv(1), dv(2), dv(3))=f(dr(1), dr(2)) using the training data TD are used as the data values of the virtual sensors SV(1) to SV(3). The complex system/system includes the real sensors SR(1) and SR(2) and the virtual sensors SV(1) to SV(3) first. When the data values measured by the real sensors in a current state during an operation are (dr(1), dr(2)), then the data values (dv(1), dv(2), dv(3)) of the virtual sensors SV(1) to SV(3) provided by a virtual sensor model 810 will have the relationship (dv(1), dv(2), dv(3))=f(dr(1), dr(2)). After the model variables of the physics-based model M and the parameters 710 between the model variables are determined, the corresponding virtual sensor model 810 is determined, and then the data values (dr(1), dr (2)) measured by the real sensors are applied to the virtual sensor model 810, the data values (dv(1), dv(2), dv(3)) of the virtual sensors SV(1) to SV(3) may be obtained in real time.

A virtual sensor model according to another embodiment of the present invention may be implemented as follows. It is assumed that the total number of real sensors installed and/or arranged in a complex system/system is Nr, the total number of virtual sensors is Nv, and the total number of sensors (real sensors+virtual sensors) that can be recognized in the complex system/system is Ns.

The real sensor SR(i) and the virtual sensor SV(i) of the target system to be operated generate data dr(i, j) and dv(i, j). SR(i) denotes an i-th real sensor, SV(i) denotes an i-th virtual sensor, dr(i, j) denotes the j-th sample data value of the i-th real sensor, and dr(i) denotes the data value vector of the i-th real sensor composed of dr(i, j). Similarly, dv(i, j) denotes the j-th sample data value of the i-th virtual sensor, and dv(i) denotes the data value vector of the i-th real sensor composed of dv(i, j).

The data vector of a first real sensor SR(1):
dr(1)=[dr(1, 1), dr(1,2), . . . , dr(1, n), . . . ]
The data vector of a second real sensor SR(2):
dr(2)=[dr(2, 1), dr(2,2), . . . , dr(2, n), . . . ]
The data vector of an Nr-th real sensor SR(Nr):
dr(Nr)=[dr(Nr, 1), dr(Nr,2), . . . , dr(Nr, n), . . . ]
The data vector of a first virtual sensor SV(1):
dv(1)=[dv(1, 1), dv(1,2), . . . , dv(1, n), . . . ]
The data vector of a second virtual sensor SV(2):
dv(2)=[dv(2, 1), dv(2,2), . . . , dv(2, n), . . . ]
The data vector of an Nv-th virtual sensor SV(Nv):
dv(Nv)=[dv(Nv, 1), dv(Nv,2), . . . , dv(Nv, n), . . . ]
and so forth.

The complex system/system simulation model M may be assumed to be a physics-based model and a digital twin model. The model M maps all real sensors SR={SR(i)|i is from 1 to Nr} and virtual sensor SV={SV(i)|i is from 1 to Nv} as model variables, and then defines their data values dr(i) and dv(i) as simulation variable values. Accordingly, a real sensor data set DR and a virtual sensor data set DV may be obtained as shown below through the j simulations in which various system operation scenarios are applied to the model M.

DR={dr(i,j)|i is from 1 to Nr, j is from 1 to the total number of simulations}
DV={dv(i,j)|i is 1 to Nv, j is from 1 to the total number of simulations}

In a virtual sensor model according to an embodiment of the present invention, an independent training data set TD(k) for one virtual sensor may be presented.

The data set TD(k) for performing machine learning on the virtual sensor SV(k) from DR and DV obtained through simulation may be represented as follows.

TD(k)⊆DR×DV=
{(dr(i,j), dv(k,j)|i is from 1 to Nr, k is ID, j is from 1 to the total number of simulations)}.

In this case, the total number of training data sets TD(k) is equal to the number of virtual sensors Nv. In the above embodiment, an independent training data set will be used to obtain one virtual sensor.

In a virtual sensor model according to another embodiment of the present invention, machine learning for simultaneously obtaining a plurality of virtual sensors may be performed. In this case, for convenience of description, there is presented an embodiment in which all virtual sensors are simultaneously obtained by machine learning. A training data set TD for obtaining all virtual sensors may be represented as follows.

TD⊆DR×DV=
{(dr(i,j), dv(k,j)|i is from 1 to Nr, k is from 1 to Nv, j is from 1 to the total number of simulations)}.

Machine learning intends to find the correlation DV=f (DR) between DR and DV, and various learning models such as artificial neural networks (ANNs) may be used. For example, in order to represent a k-th virtual sensor SV(k) by an artificial neural network NN(k), machine learning may be performed after defining an artificial neural network SV_ANN(k) using pieces of real sensor data dr(1), dr(2), . . . , dr(Nr) as inputs and an k-th virtual sensor data dv(k) as an output and then inputting a number of pieces of training data equal to the number of simulations to SV_ANN (k).

When a virtual sensor obtained through the machine learning of data collected through simulation is implemented using an artificial neural network ANN, it is assumed that an i-th virtual sensor SV(i) is implemented by an i-th artificial neural network SV_ANN(i). In this case, the system is operated with Nr real sensors and Nv virtual sensors (SV_ANN(i)|i is from 1 to Nv) attached thereto. In the case where a specific state is collected from Nr real sensors during a complex system/system operation, when it is simultaneously input to the Nv virtual sensors, the output value of the artificial neural network SV_ANN(i) may be used as the data value of the i-th virtual sensor SV(i). The complex system/system may monitor operating states on the assumption that there are Ns (=Nr+Nv) sensors.

Referring back to FIG. 8, the virtual sensor model 810 of FIG. 8 has two state variables and two real sensors as inputs and three virtual sensors as outputs. As to the virtual sensors, each virtual sensor may be implemented using an independent artificial neural network, or a plurality of virtual sensors may be implemented using a complex artificial neural network.

Application services may be expanded by adding virtual sensors through the application of the physics-based model, digital twin model, and virtual sensor model of the present invention to an IoT platform that takes into consideration only physically arranged real sensors. The virtual sensors implemented as artificial neural networks by using simulation and machine learning may be embedded in an existing IoT platform.

A computing system according to an embodiment of the present invention is a computing system for implementing a digital twin, and includes at least one processor, and a digital twin model configured to describe a complex system and including a plurality of second nodes to which a plurality of physical sensors {SR(i)|i is from 1 to Nr} arranged in the complex system corresponds. The at least one processor obtains a reference data set including the data of all nodes in the digital twin model, allows at least one virtual sensor to correspond to each of a plurality of third nodes excluding the plurality of second nodes among all the nodes in the digital twin model (e.g., assigns at least one virtual sensor to each of the plurality of third nodes), and learns the correlation between the data provided by the plurality of physical sensors and the data that the at least one virtual sensor has based on the reference data set and generates a virtual sensor model that describes the at least one virtual sensor.

The at least one processor may apply a plurality of scenarios to the digital twin model and simulate the digital twin model, and may obtain a simulation result dataset, including the data of all nodes in the digital twin model, as the reference dataset. In this case, the reference dataset may be a simulation result dataset obtained by simulating the physics-based models 210, 220, 310, and 320 of FIGS. 2 and 3. In particular, a simulation result extended by applying a plurality of scenarios and control variables to the physics-based models 220 and 320 after learning may be used as the reference data set.

The at least one processor may allocate data DR provided by the plurality of physical sensors to the plurality of second nodes, may input the data of the plurality of second nodes to the virtual sensor model SV_ANN(k), and may control the virtual sensor model SV_ANN(k) so that the virtual sensor model SV_ANN(k) learns the relevance between the data DR of the plurality of second nodes and the data DV of the plurality of third nodes.

The at least one processor may update the parameters of an existing trained model by using new data provided by the plurality of physical sensors. In this case, the at least one processor may newly allocate new data provided by the plurality of physical sensors to the plurality of second nodes, may input data DR_NEW newly allocated to the plurality of second nodes to the virtual sensor model SV_ANN(k), and may control the virtual sensor model SV_ANN(k) so that the virtual sensor model SV_ANN(k) updates a learning result for the relevance between the data DR_NEW of the plurality of second nodes and the data DV_NEW of the plurality of third nodes.

The at least one processor may provide a service for collecting and monitoring data in real time in a digital twin model including a virtual sensor by using new data provided by the plurality of physical sensors. The at least one processor may newly allocate new data provided by the plurality of physical sensors to the plurality of second nodes, may input data DR_NEW2 newly allocated to the plurality of second nodes to the virtual sensor model SV_ANN(k), and may control the virtual sensor model so that the virtual sensor model outputs the new data DV_NEW2 of the plurality of third nodes through prediction/inference.

The at least one processor may designate data, having a physical dimension different from that of the physical quantity of data detected by the plurality of physical sensors, as the physical quantity of the data of the at least one virtual sensor. In other words, the virtual sensor may be freely selected from the physical sensors, and may be set to have a quantity of different type, modality, capacity, range, and/or dimension from that of the physical sensors.

In the prior art, a physical sensor is present and a virtual sensor imitating a physical sensor is implemented based on a simulation result after the design of a digital twin of the physical sensor, so that the physical quantity detected by the virtual sensor is inevitably the same as that of the physical sensor.

However, in the present invention, information related to the passage of time and/or spatial distribution of the macroscopic or microscopic operation of the real physical sensor and the overall complex system may be obtained from original data. Accordingly, the virtual sensor may handle a physical quantity that cannot be handled by the real physical sensor, and a virtual sensor may be implemented for a spatial location where a real sensor is not arranged from the beginning. In other words, the data of the virtual sensor is not obtained directly from the physical sensor, but is obtained indirectly from the overall simulation result dataset of the simulation model (the digital twin model) of the complex system including the physical sensor. Accordingly, the virtual sensor may virtually allocate and handle a free physical quantity regardless of the type or physical quantity of the physical sensor. For example, the digital twin model may be defined as a form in which the virtual sensor detects a corresponding change in temperature at a specific location when the real physical sensor can detect the separation distance between parts, a location, an operating speed, etc.

In the present invention, the reason why a virtual sensor can be implemented at a virtual node by simulating a digital twin even when there is no real physical sensor is that original data, including real state changes associated with the passage of time and/or spatial distribution for the macroscopic or microscopic operation of an overall complex system, is utilized, as described above.

For example, assuming that a forest fire occurs, a video acquired by capturing a macroscopic operation in which the forest fire spreads in a forest may be used as original data.

In this case, it would be almost impossible to install a real sensor to check whether each tree in a forest is burning. When there is original data acquired by capturing a macroscopic operation and also there is a physics-based model capable of deducing the spread of a forest fire based on a physical law, a plurality of nodes may be set in a physics-based model and each node may be simulated such that the operation of the node is consistent with the macroscopic operation of the original data.

Each of a plurality of nodes may be obtained through simulation based on a physical law within a range consistent with the macroscopic operation. Since operation data may be obtained even when no real sensor is arranged in each node, each node may be implemented as a virtual sensor when necessary.

As another embodiment in which a virtual sensor is set to have a quantity of different of different type, modality, capacity, range, and/or dimension from that of a real sensor, for example, a real fire detection sensor configured to detect a forest fire may be arranged to detect flame, temperature, noise, etc. In this case, a change in physical quantity corresponding to all nodes in a forest may be obtained using original data such as a video acquired by recording a process in which a fire spreads. In this case, a virtual sensor may be set for all the nodes in the forest. The virtual sensor may additionally have physical quantities such as not only flame, temperature, and noise detected by a real fire detection sensor, but also a change in local airflow attributable to a fire. Thereafter, in a digital twin model for a forest in which a process in which a forest fire is spreading is simulated, when it is determined that the change in local airflow, which is a physical quantity indicated by the virtual sensor, has a large influence on the prediction of a path along which the forest fire is spreading, it may be proposed that a real sensor capable of detecting a change in local airflow be placed at the location of the virtual sensor in order to monitor a path along which a forest fire will be spreading in the future.

In other words, a virtual sensor may have a physical quantity that can be derived from a physics-based model, i.e., a digital twin model, as well as a physical quantity that is actually measured. When it is verified that a virtualized physical quantity can be used as an index having a high degree of relevance to the interpretation of a macroscopic state change, an application may be provided to propose that a sensor capable of actually measuring the virtualized physical quantity be arranged in a specific node by using a digital twin model.

A virtual sensor may be utilized in the form of a service model that intelligently guides a user through a disaster evacuation route in a cyber city, an intelligent building, or an intelligent ground structure (a tunnel, a port, a bridge, or the like) or a service model that intelligently guides a user through an optimal route based on a change in traffic flow within a cyber city.

In the case where a computing system according to an embodiment of the present invention implements a physics-based model, a digital twin model, and a virtual sensor model, when original data is one dataset, the physics-based model 220 after learning may be obtained by applying the first data 230 to the physics-based model 210, as shown in FIG. 2.

Meanwhile, for machine learning, a large amount of original data needs to be used as input. Accordingly, a computing system according to an embodiment of the present invention may generate the input training data 332 by performing preprocessing on the first data 330, which is a plurality of pieces of original data.

When it is difficult to obtain a plurality of pieces of original data due to the nature of the original data, a computing system according to an embodiment of the present invention may expand and additionally generate the input training data 332 by using a plurality of scenarios and control variables.

For example, the physics-based model 320 after machine learning may be generated using the input training data 332, and then a reference dataset capable of converting the physics-based model 320 into a virtual sensor model 810 may be further expanded and supplemented by performing the simulation to which a plurality of scenarios is applied.

In this case, when a service model targeted by a complex system is an embodiment that analyzes the occurrence of a forest fire and the spread of a forest fire, a plurality of scenarios may expand datasets by diversifying weather environmental conditions such as wind strength, wind direction, temperature, and humidity.

When a service model targeted by a complex system is a traffic congestion simulation, a plurality of scenarios may include a case where a traffic accident is assumed to occur at a specific location, a case where traffic is controlled according to an event in a specific area, etc.

At least one processor according to an embodiment of the present invention may control the virtual sensor model so that the virtual sensor model predicts the value of any one fourth node of the plurality of third nodes in the digital twin model and the value of a first virtual sensor corresponding to the fourth node under the condition that the plurality of second nodes and the plurality of physical sensors match each other so that the plurality of second nodes in the digital twin model has the value of data provided by the plurality of physical sensors based on the reference data set. In this case, the physical sensors and the virtual sensors do not correspond to each other in a one-to-one correspondence, but the data of the virtual sensors may be obtained from the collective data of the physical sensors. There is proposed an embodiment in which an independent model (a separate type) for one virtual sensor (the fourth sensor) is implemented.

At least one processor according to another embodiment of the present invention may control the virtual sensor model so that the virtual sensor model predicts the value of each of a plurality of second virtual sensors corresponding to each of the plurality of third nodes in the digital twin model under the condition that the plurality of second nodes and the plurality of physical sensors match each other so that the plurality of second nodes in the digital twin model has the value of data provided by the plurality of physical sensors based on the reference data set. Even in this case, the physical sensors and the virtual sensors do not correspond to each other in a one-to-one correspondence, but the data of the virtual sensors may be obtained from the collective data of the physical sensors. In this case, there is proposed an embodiment in which a plurality of virtual sensors is implemented as one model (an integrated type) when a model of one virtual sensor cannot be extracted.

Figure 9:
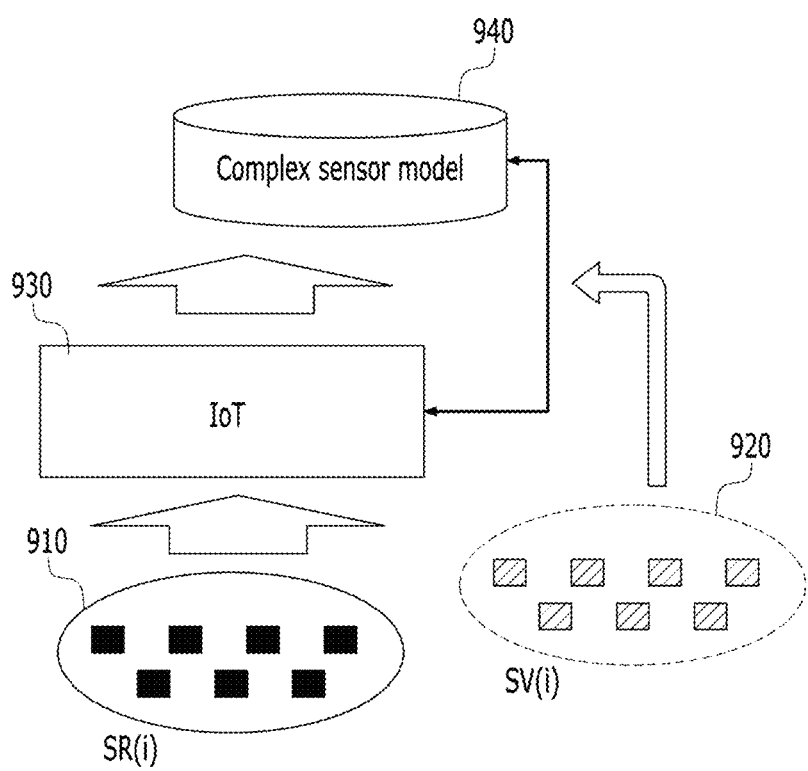
FIG. 9 shows a case in which a virtual sensor is located and provided at a higher layer than a real physical sensor as an example of a service model that is provided by a computing system according to an embodiment of the present invention.

FIG. 9 shows a case in which a virtual sensor 920 is located and provided at a higher layer than a real physical sensor 910 as an example of a service model that is provided by a computing system according to an embodiment of the present invention.

The virtual sensor 920 is coupled to an IoT platform 930 composed of only the real physical sensor 910, so that an complex sensor model 940 is provided. In this case, the virtual sensor 920 is implemented in a higher layer than the real physical sensor 910, and is coupled to the IoT platform 930 to form the complex sensor model 940. Data obtained from each of the IoT platform 930 and the complex sensor model 940 is shared with each other, and the IoT platform 930 and the complex sensor model 940 may be updated through complementary data.

Figure 10:
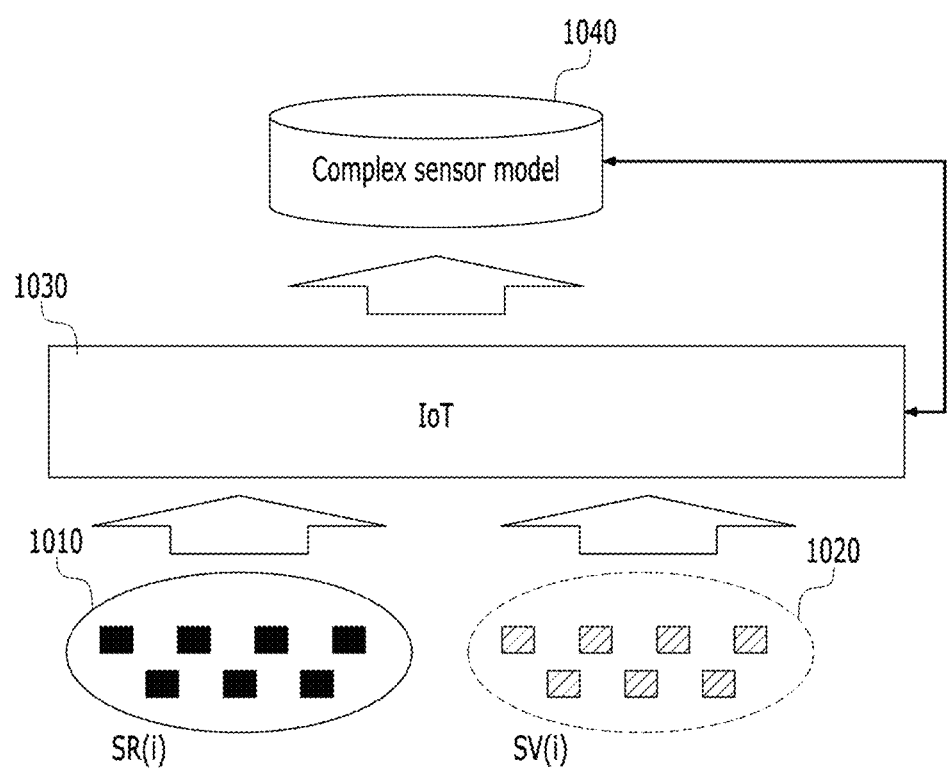
FIG. 10 shows a case where a virtual sensor is located and provided in the same layer as a real physical sensor as an example of a service model that is provided by a computing system according to an embodiment of the present invention.

FIG. 10 shows a case where a virtual sensor is located and provided in the same layer as a real physical sensor as an example of a service model that is provided by a computing system according to an embodiment of the present invention.

In FIG. 10, a real physical sensor 1010 and a virtual sensor 1020 are implemented in the same layer and are coupled to each other to form an IoT platform 1030, and the IoT platform 1030 may implement an complex sensor model 1040. Data obtained from each of the IoT platform 1030 and the complex sensor model 1040 is shared with each other, and the IoT platform 1030 and the complex sensor model 1040 may be updated through complementary data.

Figure 11:
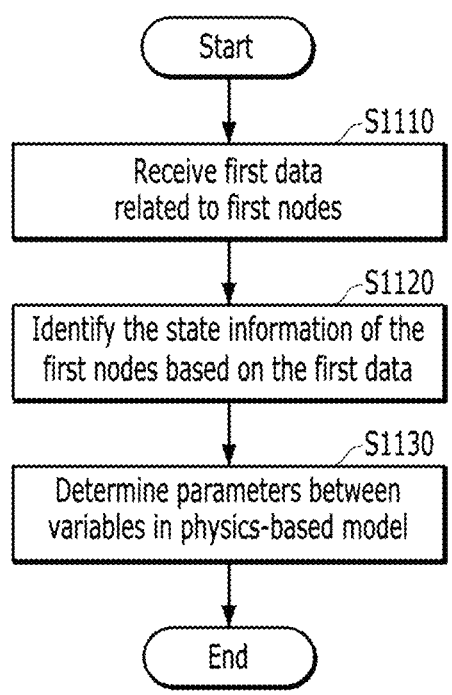
FIG. 11 is an operation flowchart showing an example of a method of providing a physics-based model that is performed by a computing system according to an embodiment of the present invention.

FIG. 11 is an operation flowchart showing an example of a method of providing a physics-based model that is performed by a computing system according to an embodiment of the present invention.

The method of providing a physics-based model that is executed in a computing system according to an embodiment of the present invention is performed in a computing system, including a physics-based model configured to describe a physical complex system and perform deductive inference, and at least one processor. The method of providing a physics-based model includes: step S1110 of receiving, by the at least one processor, first data obtained such that the state information of first nodes, which are at least some of a plurality of nodes included in the physics-based model, is included therein in association with at least one of the passage of time and spatial distribution; step S1120 of identifying, by the at least one processor, the state information for each of the first nodes in the physics-based model based on the first data in association with at least one of the passage of time and spatial distribution; and step S1130 of determining, by the at least one processor, parameters between variables in the physics-based model so that the state information can be reproduced (by modeling and/or simulation) for each of the first nodes in association with at least one of the passage of time and spatial distribution.

Figure 12:
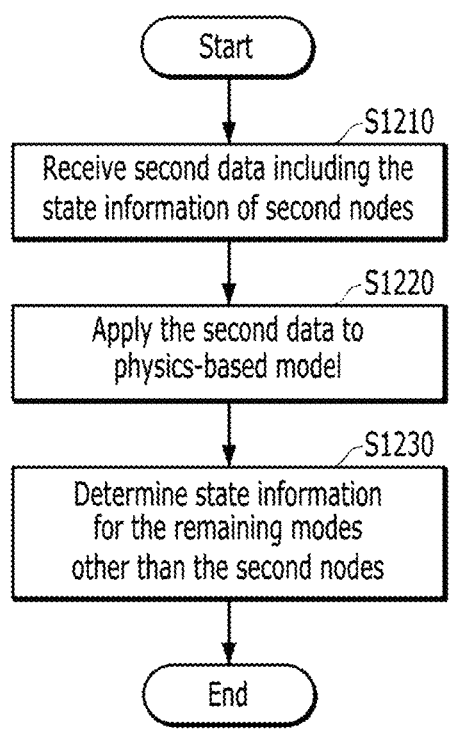
FIG. 12 is an operation flowchart showing another example of a method of providing a physics-based model that is performed by a computing system according to an embodiment of the present invention.

FIG. 12 is an operation flowchart showing another example of a method of providing a physics-based model that is performed by a computing system according to an embodiment of the present invention.

The method of providing a physics-based model may further include: step S1210 of receiving, by the at least one processor, second data obtained such that the state information of second nodes, which are at least some of the plurality of nodes included in the physics-based model whose internal parameters are determined through step S1130, is included therein; and the step of generating, by the at least one processor, third data including state information for all of the plurality of nodes included in the physics-based model by inputting/applying the second data to the physics-based model (S1220). In this case, the step of generating third data may include step S1230 of determining state information for the remaining nodes other than the second nodes.

The first nodes refer to nodes which can identify state information based on the first data, and the second nodes refer to nodes in which real sensors are arranged and which can obtain sensor data. According to an embodiment, the first nodes and the second nodes may coincide. According to another embodiment, the first nodes and the second nodes may not coincide.

Figure 13:
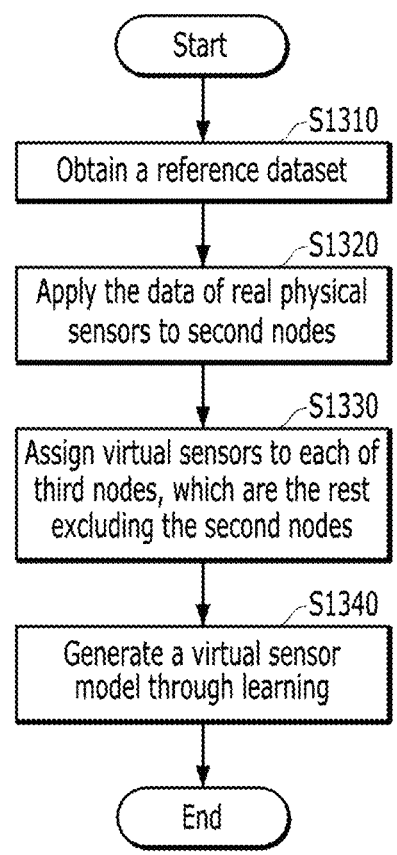
FIG. 13 is an operation flowchart showing an example of a method of providing a digital twin model including a virtual sensor model that is performed by a computing system according to an embodiment of the present invention.

FIG. 13 is an operation flowchart showing an example of a method of providing a digital twin model including a virtual sensor model that is performed by a computing system according to an embodiment of the present invention.

The method of providing a digital twin model that is executed in a computing system according to an embodiment of the present invention is performed in a computing system, including a digital twin model configured to describe a physical complex system and including a plurality of second nodes corresponding to a plurality of physical sensors arranged in the complex system, and at least one processor. The method of providing a digital twin model includes: step S1310 of obtaining, by the at least one processor, a reference dataset including the data of all nodes in the digital twin model; step S1320 of applying, by the at least one processor, the data of real physical sensors to the plurality of second nodes; step S1330 of assigning, by the at least one processor, at least one virtual sensor to each of a plurality of third nodes, which are the rest excluding the plurality of second nodes among all the nodes in the digital twin model; and step S1340 of learning, by the at least one processor, the correlation between the data provided by the plurality of physical sensors and the data that the at least one virtual sensor has based on the reference data set, and generating, by the at least one processor, a virtual sensor model that describes the at least one virtual sensor.

Figure 14:
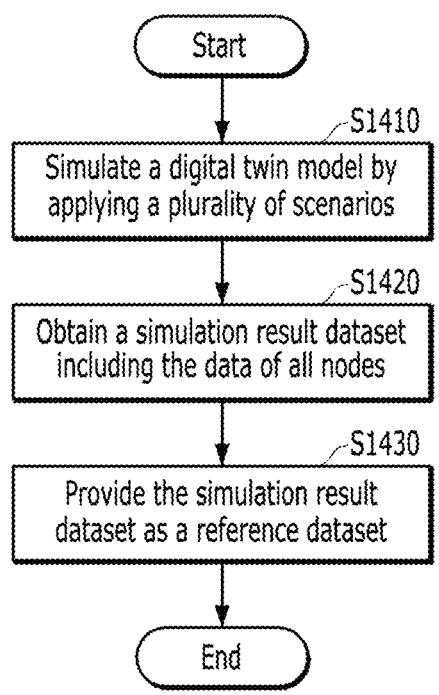
FIG. 14 is an operation flowchart showing an example of a method of providing a reference dataset to a digital twin model that is performed by a computing system according to an embodiment of the present invention.

FIG. 14 is an operation flowchart showing an example of a method of providing a reference dataset to a digital twin model that is performed by a computing system according to an embodiment of the present invention.

In this case, step S1310 of obtaining a reference data set may include: step S1410 of simulating, by the at least one processor, the digital twin model by applying a plurality of scenarios to the digital twin model; step S1420 of obtaining, by the at least one processor, a simulation result dataset including the data of all the nodes in the digital twin model; and step S1430 of obtaining and providing, by the at least one processor, the simulation result dataset, including the data of all the nodes in the digital twin model, as the reference dataset.

A method of providing a physics-based model, a method of providing a digital twin, a method of providing a virtual sensor model, and/or a method of collecting data using a virtual sensor model according to an embodiment of the present invention may be implemented in the form of program instructions executable by a variety of computing means and then stored in a computer-readable storage medium. The computer-readable storage medium may include program instructions, data files, and data structures solely or in combination. Program instructions recorded in the storage medium may have been specially designed and configured for the present invention, or may be known to or available to those who have ordinary knowledge in the field of computer software. Examples of the computer-readable storage medium include all types of hardware devices specially configured to record and execute program instructions, such as magnetic media, such as a hard disk, a floppy disk, and magnetic tape, optical media, such as compact disk (CD)-read only memory (ROM) and a digital versatile disk (DVD), magneto-optical media, such as a floptical disk, ROM, random access memory (RAM), and flash memory. Examples of the program instructions include machine code, such as code created by a compiler, and high-level language code executable by a computer using an interpreter. These hardware devices may be configured to operate as one or more software modules in order to perform the operation of the present invention, and the vice versa.

However, the present invention is not limited to the embodiments. Like reference symbols in the drawings designate like components. The lengths, heights, sizes, widths, etc. introduced in the embodiments and drawings of the present invention may be exaggerated to help to understand the present invention.

Although the present invention has been described with reference to specific details such as the specific components, and the limited embodiments and drawings, these are provided merely to help a general understanding of the present invention, and the present invention is not limited thereto. Furthermore, those having ordinary skill in the art to which the present invention pertains may make various modifications and variations from the above detailed description.

Therefore, the spirit of the present invention should not be defined based only on the described embodiments, and not only the attached claims but also all equivalents to the claims should be construed as falling within the scope of the spirit of the present invention.

INDUSTRIAL APPLICABILITY

A computing system according to an embodiment of the present invention is a computing system for implementing a physics-based model, and includes a physics-based model configured to describe a physical complex system and perform deductive inference, and at least one processor. The at least one processor is configured to receive first data obtained such that the state information of first nodes, which are at least some of a plurality of nodes included in the physics-based model, is included therein in association with at least one of the passage of time and spatial distribution, to identify the state information for each of the first nodes in the physics-based model based on the first data in association with at least one of the passage of time and spatial distribution, and to determine parameters between variables in the physics-based model so that the state information can be reproduced for each of the first nodes in association with at least one of the passage of time and spatial distribution.

What is claimed is:

1. A computing system for implementing a physics-based model, the computing system comprising:
   a physics-based model to be implemented to describe a physical complex system and be capable of performing deductive inference; and
   at least one processor,
   wherein the at least one processor is configured to:
      receive first data obtained such that state information of first nodes, which are at least some of a plurality of nodes included in the physics-based model, is included therein in association with at least one of a passage of time and spatial distribution;
      identify the state information for each of the first nodes in the physics-based model based on the first data in association with at least one of the passage of time and spatial distribution, wherein changes in the state information of the first nodes with a passage of time are represented in the first data;
      identify the changes in the state information of the first nodes with the passage of time based on the first data; and
      determine parameters between variables in the physics based model, the parameters being representative of at least the relevance between the state information of the first nodes with the passage of time and the state information of the other nodes spatially adjacent to the first nodes in the physics-based model so that the changes in the state information of the first nodes with the passage of time can be reproduced,
   wherein the physics-based model includes, as the variables, at least the state information of the first nodes with the passage of time,
   wherein the physics-based model includes, as the parameters, at least relevance between the state information of the first nodes with the passage of time and state information of other nodes spatially adjacent to the first nodes, and
   wherein the physical-based model provides virtual measured value in real time for a quantity of different range, capacity and/or dimension from a physical quantity measured by a real physical sensor in the physical complex system.

2. The computing system of claim 1, wherein the at least one processor is further configured to determine the parameters between the variables in the physics-based model by performing machine learning on the state information associated with at least one of the passage of time and the spatial distribution for each of the first nodes.

3. The computing system of claim 1, wherein the at least one processor is further configured to:
   receive second data obtained such that state information of second nodes, which are at least some of the plurality of nodes included in the physics-based model, is included therein; and
   generate third data including state information for all of the plurality of nodes included in the physics-based model by inputting the second data to the physics-based model.

4. The computing system of claim 3, wherein the at least one processor is further configured to:
   determine that the second nodes included in the third data have a value that is given by the second data; and
   determine that remaining nodes other than the second nodes included in the third data have a value that is inferred based on the second data by the physics-based model.

5. The computing system of claim 1, wherein at least some of the plurality of nodes are set to have state information of a physical dimension different from that of rest of the plurality of nodes.

6. A computing system for implementing a digital twin model, the computing system comprising:
   at least one processor; and
   a digital twin model configured to describe a physical complex system, and including a plurality of second nodes corresponding to a plurality of physical sensors arranged in the complex system;
   wherein the at least one processor is configured to:
      obtain a reference dataset including data of all nodes in the digital twin model;

assign at least one virtual sensor to each of a plurality of third nodes, which are a rest excluding the plurality of second nodes among all the nodes in the digital twin model;

learn a correlation between data provided by the plurality of physical sensors and data that the at least one virtual sensor has based on the reference data set, and generate a virtual sensor model that describes the at least one virtual sensor;

allocate data, provided by the plurality of physical sensors, to the plurality of second nodes;

input data of the plurality of second nodes to the virtual sensor model;

control the virtual sensor model so that the virtual sensor model learns relevance between the data of the plurality of second nodes and data of the plurality of third nodes;

repeat said allocating and inputting steps for new data; and control the virtual sensor model so that the virtual sensor model updates a learning result for the relevance between the data of the plurality of second nodes and the data of the plurality of third nodes, and wherein the virtual sensor model provides virtual measured value in real time for a quantity of different range, capacity and/or dimension from a physical quantity measured by the plurality of physical sensors arranged in the complex system.

7. The computing system of claim 6, wherein the at least one processor is further configured to:
simulate the digital twin model by applying a plurality of scenarios to the digital twin model; and
obtain a simulation result dataset, including the data of all the nodes in the digital twin model, as the reference dataset.

8. The computing system of claim 6, wherein the at least one processor is further configured to designate data, having a physical dimension different from that of a physical quantity of data detected by the plurality of physical sensors, as a physical quantity of data of the at least one virtual sensor.

9. The computing system of claim 6, wherein the at least one processor is further configured to control the virtual sensor model so that the virtual sensor model predicts a value of any one fourth node of the plurality of third nodes in the digital twin model and a value of a first virtual sensor corresponding to the fourth node under a condition that the plurality of second nodes and the plurality of physical sensors match each other so that the plurality of second nodes in the digital twin model has a value of data provided by the plurality of physical sensors based on the reference data set.

10. The computing system of claim 6, wherein the at least one processor is further configured to control the virtual sensor model so that the virtual sensor model predicts a value of each of a plurality of second virtual sensors corresponding to each of the plurality of third nodes in the digital twin model under a condition that the plurality of second nodes and the plurality of physical sensors match each other so that the plurality of second nodes in the digital twin model has a value of data provided by the plurality of physical sensors based on the reference data set.

11. The computing system of claim 6, wherein the virtual sensor model is a model using an artificial neural network.

12. A method of providing a physics-based model, the method being performed in a computing system including a physics-based model configured to describe a physical complex system and perform deductive inference and at least one processor, the method comprising:

receiving, by the at least one processor, first data obtained such that state information of first nodes, which are at least some of a plurality of nodes included in the physics-based model, is included therein in association with at least one of a passage of time and spatial distribution;

identifying, by the at least one processor, the state information for each of the first nodes in the physics-based model based on the first data in association with at least one of the passage of time and spatial distribution, wherein changes in the state information of the first nodes with a passage of time are represented in the first data;

identifying, by the at least one processor, the changes in the state information of the first nodes with the passage of time based on the first data; and determine, by the at least one processor, parameters between variables in the physics based model, the parameters being representative of at least the relevance between the state information of the first nodes with the passage of time and the state information of the other nodes spatially adjacent to the first nodes in the physics-based model so that the changes in the state information of the first nodes with the passage of time can be reproduced, wherein the physics-based model includes, as the variables, at least the state information of the first nodes with the passage of time, wherein the physics-based model includes, as the parameters, at least relevance between the state information of the first nodes with the passage of time and state information of other nodes spatially adjacent to the first nodes, and wherein the physical-based model provides virtual measured value in real time for a quantity of different range, capacity and/or dimension from a physical quantity measured by a real physical sensor in the physical complex system.

13. The method of claim 12, further comprising:
receiving, by the at least one processor, second data obtained such that state information of second nodes, which are at least some of the plurality of nodes included in the physics-based model, is included therein; and
generating, by the at least one processor, third data including state information for all of the plurality of nodes included in the physics-based model by inputting the second data to the physics-based model.

14. A method of providing a digital twin model, the method being performed in a computing system including a digital twin model configured to describe a physical complex system and including a plurality of second nodes corresponding to a plurality of physical sensors arranged in the complex system and at least one processor, the method comprising:

obtaining, by the at least one processor, a reference dataset including data of all nodes in the digital twin model;

assigning, by the at least one processor, at least one virtual sensor to each of a plurality of third nodes, which are a rest excluding the plurality of second nodes among all the nodes in the digital twin model;

learning, by the at least one processor, a correlation between data provided by the plurality of physical sensors and data that the at least one virtual sensor has based on the reference data set, and generating, by the at least one processor, a virtual sensor model that describes the at least one virtual sensor;

allocating, by the at least one processor, data, provided by the plurality of physical sensors, to the plurality of second nodes;

inputting, by the at least one processor, data of the plurality of second nodes to the virtual sensor model;

controlling, by the at least one processor, the virtual sensor model so that the virtual sensor model learns relevance between the data of the plurality of second nodes and data of the plurality of third nodes;

repeating, by the at least one processor, said allocating and inputting steps for new data; and controlling, by the at least one processor, the virtual sensor model so that the virtual sensor model updates a learning result for the relevance between the data of the plurality of second nodes and the data of the plurality of third nodes, and wherein the virtual sensor model provides virtual measured value in real time for a quantity of different range, capacity and/or dimension from a physical quantity measured by the plurality of physical sensors arranged in the complex system.

15. The method of claim 14, wherein the obtaining comprises:

simulating, by the at least one processor, the digital twin model by applying a plurality of scenarios to the digital twin model; and obtaining, by the at least one processor, a simulation result dataset, including the data of all the nodes in the digital twin model, as the reference dataset.

* * * * *